United States Patent
Opsahl

Patent Number: 6,108,393
Date of Patent: Aug. 22, 2000

[54] ENHANCED PRESCALER PHASE INTERFACE

[75] Inventor: Paul L. Opsahl, Cedar Rapids, Iowa

[73] Assignee: Rockwell Collins, Inc., Cedar Rapids, Iowa

[21] Appl. No.: 09/257,441

[22] Filed: Feb. 25, 1999

[51] Int. Cl.$^7$ .................................... H03K 21/00
[52] U.S. Cl. ............................................. 377/47
[58] Field of Search ............................... 377/47

[56] References Cited

U.S. PATENT DOCUMENTS

| | | | |
|---|---|---|---|
| 4,575,867 | 3/1986 | Hogue | 377/110 |
| 5,878,101 | 3/1999 | Aisaka | 377/47 |
| 5,940,467 | 8/1999 | Fransson | 377/47 |
| 5,966,421 | 2/2000 | Haubursin et al. | 377/47 |
| 6,031,425 | 2/2000 | Hasegawa | 377/47 |

*Primary Examiner*—Margaret R. Wambach
*Attorney, Agent, or Firm*—Nathan O. Jensen; Kyle Eppele; J. P. O'Shaughnessy

[57] ABSTRACT

A programmable prescaler for scaling an input frequency into a desired output frequency including an input divider having an input connected to the input frequency and a divided output, a first counter, having an input connected to the divided output of the input divider and a terminal count output; and a second counter coupled to the terminal count output of the first counter having a scaled-frequency output. The second counter may be a divide by two counter, and may be coupled to the terminal count output of the first counter via the input divider. The input divider further may further include a plurality of divider stages, the input frequency and the terminal count output being cascaded through the plurality of divider stages, and wherein the second counter is coupled to the terminal count output of the first counter via the plurality of divider stages of the input divider. The terminal count output of the first counter may be coupled to a first divider stage of the plurality of divider stages, and an output of the first divider stage of the plurality of divider stages may be connected to a clock input of the second counter. The first counter may be a programmable binary counter. The scaled frequency output may be a signal having a duty cycle of approximately 50% and a frequency of one-half the desired output frequency. Additionally, the programmable prescaler may further comprise an edge detector coupled to the scaled frequency output of the second counter.

22 Claims, 5 Drawing Sheets

FIG. 1 _PRIOR ART_

ENHANCED PRESCALER PHASE INTERFACE

BACKGROUND

This invention relates in general to frequency prescalers, and to high-speed prescalers and prescaling methods in particular.

Frequency synthesizers which utilize phase-locked loop (PLL) circuits may be useful in various types of electronic equipment, such as radio-frequency signal generators, test equipment, radio-frequency telecommunications equipment, and lightwave telecommunications equipment. One known method of synthesizing a desired frequency involves dividing the desired frequency by a preselected value in a PLL.

Frequency synthesizers based on PLL circuits which can divide a desired frequency by a range of values are also known. One such frequency synthesizer has a B+N frequency prescaler. A B+N prescaler is a cascaded prescaler that divides a desired frequency by "B" plus "N". Such prescalers may have "noisy" output signals and may have output signals which are insufficient in duration, and cannot achieve a sufficiently low minimum divide value for many applications.

Therefore, there is a need for a prescaler that can be configured to divide over a wide range of values, with a low minimum divide value, low noise, and which provides an easily detected output signal.

SUMMARY

In one embodiment of the invention, a novel programmable prescaler for scaling an input frequency into a scaled output frequency is provided. This embodiment of the programmable prescaler includes an input divider having an input connected to the input frequency signal and a divided output providing a divided frequency signal, a first counter, having an input connected to the divided output of the input divider and a terminal count output; and a second counter having an input coupled to the terminal count output of the first counter and having a scaled output providing a scaled frequency signal. The second counter may be a divide by two counter, and may be coupled to the terminal count output of the first counter via the input divider.

In one embodiment, the input divider may further include a plurality of divider stages, the input frequency signal and the terminal count output being cascaded through the plurality of divider stages, and wherein the second counter is coupled to the terminal count output of the first counter via the plurality of divider stages of the input divider. The terminal count output of the first counter may be coupled to a first divider stage of the plurality of divider stages, and an output of the first divider stage of the plurality of divider stages may be connected to a clock input of the second counter. Each divider stage of the plurality of divider stages may be a 2/3 divider, having a frequency input, a first data input, a second data input, and a frequency output, wherein the 2/3 divider is a divide by two circuit when either the first data input or second data input is inactive, and wherein the 2/3 divider is a divide by three circuit when both the first data input and the second data input are active.

The output of the first 2/3 divider stage may be connected to a clock input of the second counter. The first data input may comprise a predetermined number of input frequency clock cycles to be added to the input divider, and the second data input may be coupled to the terminal count output of the first counter. The first counter may be a programmable binary counter.

The scaled frequency signal may have a duty cycle of approximately 50% and a frequency of one-half the desired output frequency. The programmable prescaler of this embodiment may be used in combination with a phase detector having an edge detector coupled to the scaled output of the second counter.

DETAILED DESCRIPTION

Figure 1:
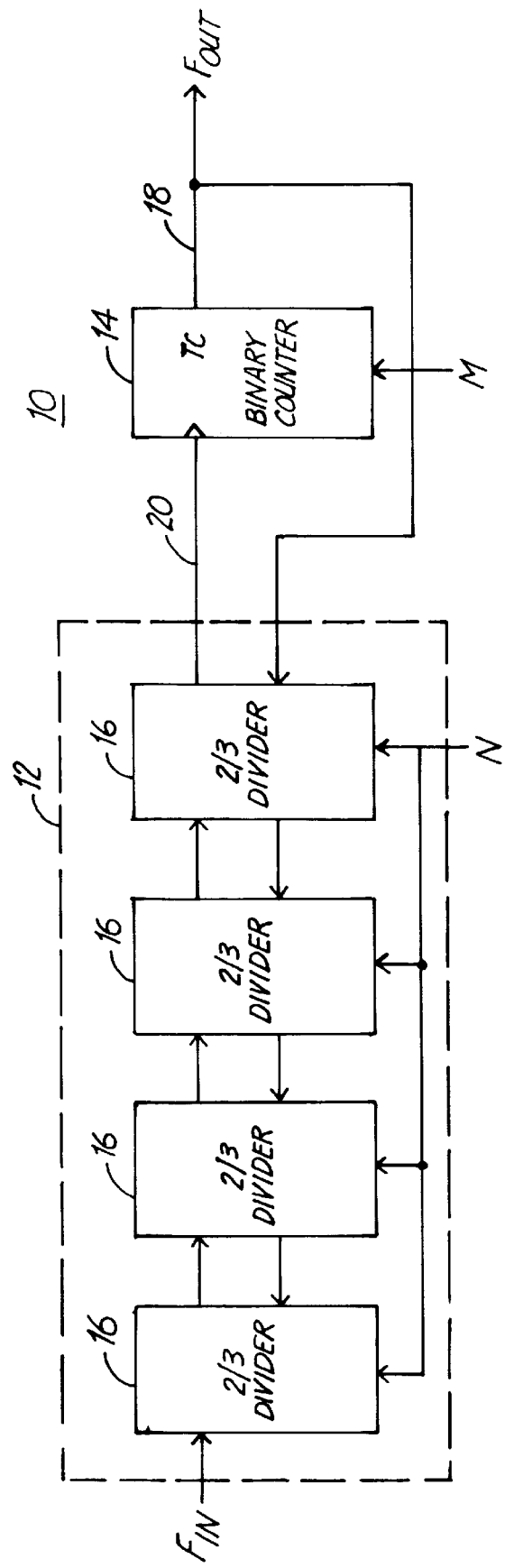
FIG. 1 is a block diagram of a prior art programmable prescaler.

High speed programmable prescalers are known. See, for example, U.S. Pat. No. 4,575,867, which is incorporated by reference. Referring to FIG. 1, known high speed programmable prescalers 10 have an input divider 12 capable of dividing by powers of 2, and a binary counter 14, capable of dividing by any integer greater than one. One known input divider 12 divides an input frequency $f_{in}$ into a divided frequency signal 20 with a cascaded plurality of "n" dividers 16 capable of dividing by 2, or, on command, by 3 (known as a "2/3 divider"). The input divider 12 divides the input frequency by the formula $2^n+N$, where N is less than $2^n$. For example, having n=4 and N=0 results in four 2/3 dividers 16, each set to divide by 2. The input divider 12 therefore divides the input frequency by $2^4+0=16$. Using the same example, but setting N to three, configures the two least significant bits of N to a logic 1. When initialized by an active terminal count signal 18, the input divider 12 performs a "plus N" sequence. In the example of N=3, two of the 2/3 dividers 16 divide by 3 instead of 2. The result is an input divider that divides the input frequency by $2^4+3=19$.

There are several known binary counters. In one example, a control signal M configures the binary counter 14 to output a terminal count strobe 18 upon counting "M" cycles on the clock input of the binary counter. Binary counters of one known type can be programmed to count from 1 to M where $1 \leq M < 2^b$, where "b" is the number of bits available to control the binary counter. In the known example, the binary counter 14 is clocked by the divided frequency signal 20 of the input divider 12. The terminal count strobe 18 has the desired scaled frequency, but may include spurious transitions due to the internal structure of the binary counter 14. Generally, the scaled output frequency of the known example is derived by retiming the terminal count strobe 18 to eliminate the spurious transitions. The minimum count for the binary counter 14 is two, allowing the scaled output frequency to toggle. Setting M=1 will generate a constant terminal count strobe 18, resulting in an inactive scaled output frequency. The scaled output frequency of the prescaler of FIG. 1 scales the input frequency by a range of $2^n 2^1 \leq N \leq 2^n 2^m - 1$. Where n=4 and m=4, the prescaler can be programmed to divide by 32 through 255.

The known prescaler 10 shown in FIG. 1 may be unsatisfactory for use with input frequencies in the range of 3 GHz. First, the terminal count strobe 18 of the binary counter 14 has a duration of one binary counter 14 input clock cycle. In the known prescaler 10, the binary counter 14 is clocked by the divided frequency signal 20 of the final 2/3 input divider stage 16. Therefore, the output strobe varies in duration based on the setting of the input divider 12. In the illustrated example, the output strobe may be as narrow as 16 input frequency clock cycles. At 3 GHz, such an output strobe may be too narrow to reliably distribute to other circuits. Also, because the binary counter 14 is clocked by a signal that is the result of an input frequency that has been cascaded through several stages of logic, an undesirable level of noise may be present on the output strobe 18. Finally, where the output strobe 18 is generated by the binary counter, as known in the prior art, the minimum value for "M"=2, doubling the minimum count for the prescaler and undesirably narrowing the range of programmable frequency division.

Figure 2:
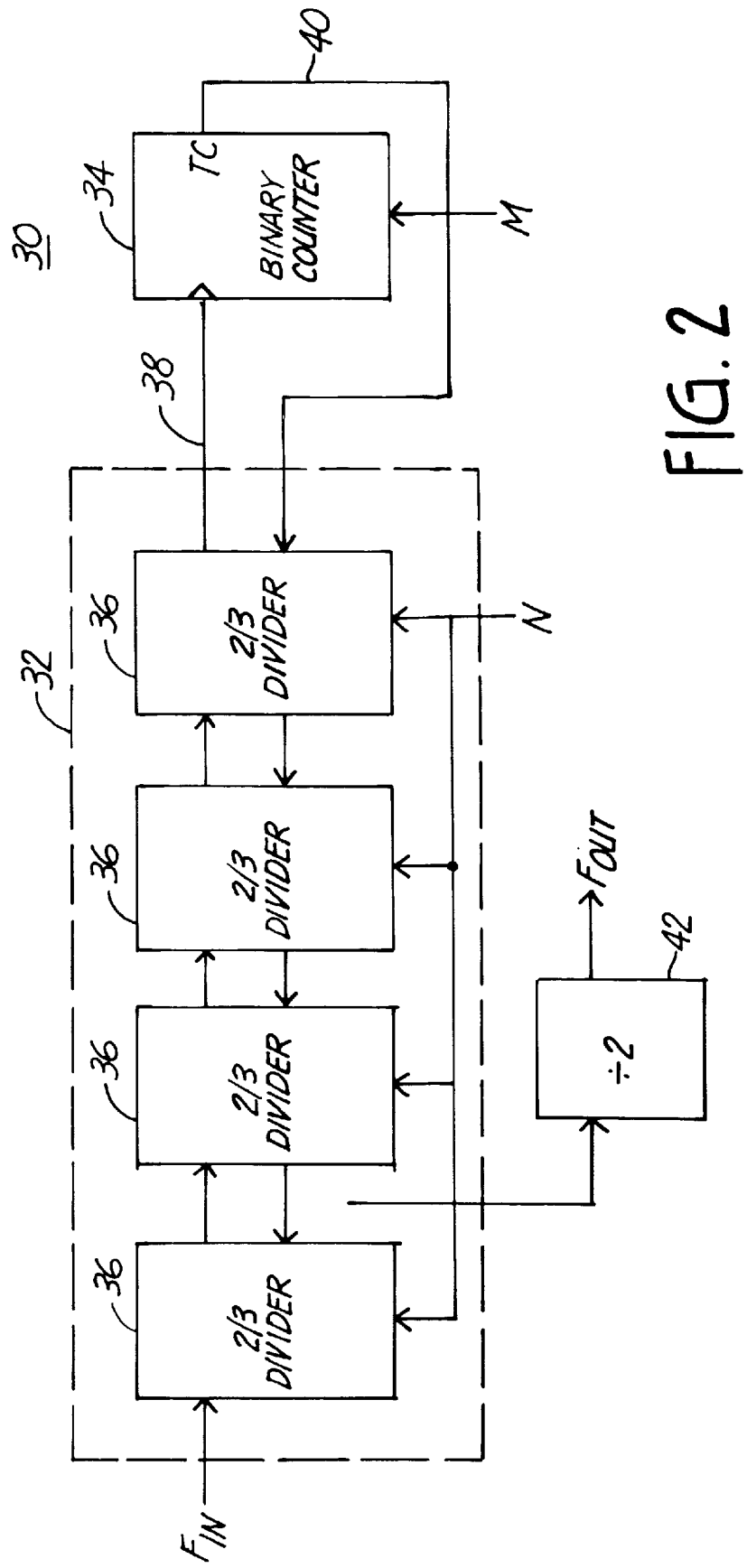
FIG. 2 is a block diagram of one example of a prescaler of the present invention.
Figure 4:
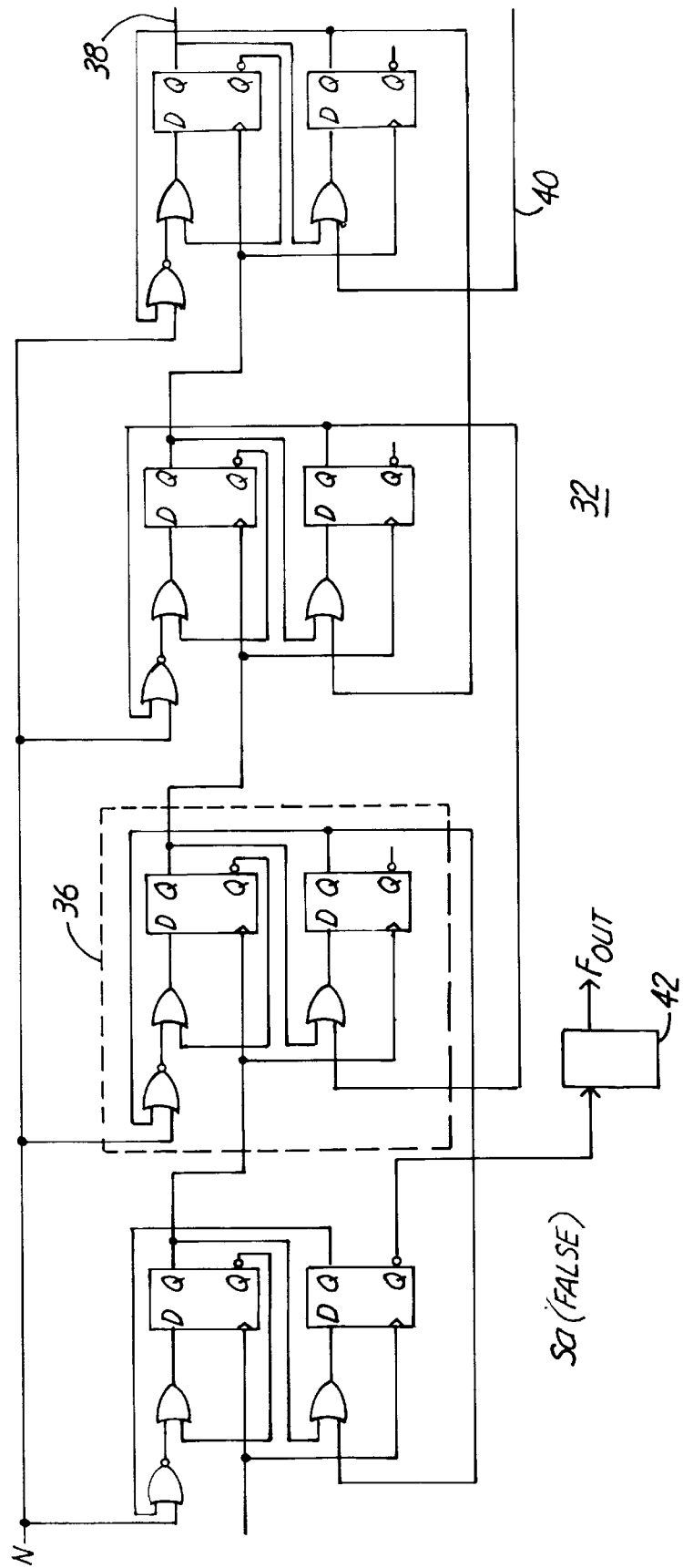
FIG. 4 is a schematic illustration of one example of a prescaler of the present invention.

One illustrative embodiment of a prescaler 30 according to the present invention is shown in FIG. 2. The prescaler of FIG. 2 has an input divider 32 and a binary counter 34. The input divider 32 is a conventional cascade of 2/3 dividers 36. The example illustrated in FIG. 4 has four 2/3 dividers 36, but any number may be used as desired for any particular application. The divided frequency signal 38 of the input divider 32 is connected to the clock input of the binary counter 34. The binary counter 34 is preferably programmable to count to M, where M is any integer. In the illustrated example, the binary counter 34 has four bits which results in a maximum "M" of $2^4-1=15$. The invention is not limited to the example of an "M" of less than or equal to 15, however, and binary counter 34 may have more or fewer than 4 bits depending on a given use. The terminal count output strobe 40 of the binary counter 34 strobes the input divider 32. When the terminal count output strobe 40 of the binary counter is not active, each stage of the input divider 32 divides by two, resulting in the input divider 32 as a whole dividing the input frequency by 16. When the terminal count output strobe 40 is active, preselected stages of the input divider 32 absorb an extra clock signal, adding "N" counts to the input divider 32. In the example illustrated in FIG. 2, setting M=3 and N=5 would therefore result in the terminal count 40 going active every 53 input frequency clock cycles (16×3("M")+5 ("N")).

Unlike the known prescaler, the terminal count output strobe 40 does not directly provide the scaled output frequency of the prescaler 30. Therefore, retiming the output strobe to eliminate spurious transitions of the terminal count output strobe 40 is not necessary. Also unlike the known prescalers, the binary counter 34 may be programmed to a minimum count of one, extending the programmable range of the prescaler 30 by halving the minimum count of the prescaler 30. The embodiment shown in FIG. 2 scales the input frequency by a range of $2^n 2^0 \leq N \leq 2^n 2^m - 1$. Where n=4 and m=4 as illustrated, the prescaler 30 can be programmed to divide by 16 through 255.

Figure 3:
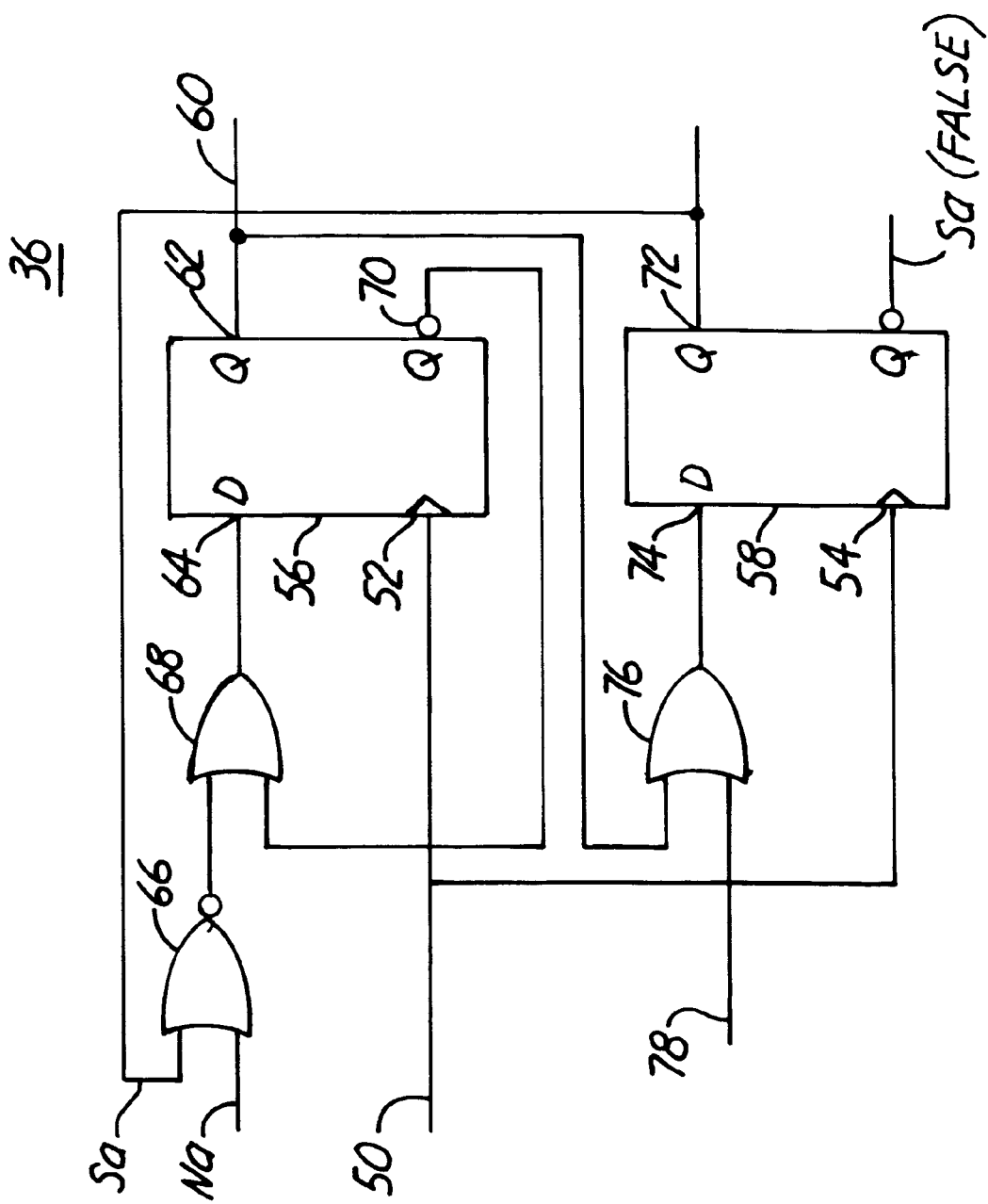
FIG. 3 is a schematic illustration of an example of one stage of the input divider.

An example of a typical stage 36 of the input divider 32 is shown in FIG. 3. A stage input signal 50 drives clock inputs 52 and 54 on a divider flip-flop 56 and a strobe flip-flop 58. A stage output signal 60 is driven by the "true" output 62 of the divider flip-flop 56. The data input 64 of the divider flip-flop 56 is provided by a NOR gate 66, having inputs Na (False) and Sa cascaded through an OR gate 68, having additional input of the "False" output 70 of the divider flip-flop 56. Na (False) represents the "a" bit of the "N" value added to the input divider 32. "Sa" is the "true" output 72 of the strobe flip-flop 58. The data input 74 of the strobe flip-flop 58 is provided by an OR gate 76 having an Add "N" strobe signal 78 (active false) and the stage output signal 60.

When the Add "N" strobe 78 is high, Sa remains high, the output of the NOR gate remains low, and the divider flip-flop 56 clocks in its own "False" output 70, thereby toggling logic states with every cycle of the stage input signal 50. This is one example of a divide by two circuit. When the binary counter 34 reaches its terminal count, the Add "N" strobe 78 of the final input divider 2/3 stage goes low (active). Sa will go low on the first clock cycle after the stage output signal 60 is low. If at that time Na (False) is low (active), the divider flip-flop 56 will hold the stage output signal 60 high for an extra input clock cycle, thereby dividing by 3 (adding Na to the "divide by sequence").

In the illustrated embodiment of FIG. 2, the first stage 36 of the input divider 32 is connected to a divide-by-2 counter 42. In an alternative embodiment, the counter 42 may divide by some other number. The divide-by-2 counter 42 is clocked by the false output Sa (False) of a strobe flip-flop output of the first stage. Sa (False) goes high only when the binary counter 34 has reached its terminal count and the input divider 32 is adding "N" to the dividing sequence. Thus, the output $f_{out}$ of the divide-by-2 counter 42 toggles the output logic state every time the prescaler 30 reaches its programmed divide-by-count.

The divide by two output $f_{out}$ provides advantages over known prescalers. For example, the output signal is a 50% duty cycle signal having a period of twice the programmed output frequency. This signal is much more robust than the narrow-width pulse generated by the terminal count pulse of the binary counter. Also, the divide by 2 output $f_{out}$ has less noise because the input signal $f_{in}$ is passed through only one stage of the input divider, rather than cascading through all "n" stages of the input divider and the binary counter. Additionally, use of the divide by two counter allows "M" to be set to one, as previously described.

Another embodiment of the present invention comprises a phase-locked loop circuit having a prescaler 30 coupled to an edge recovery circuit. The wide-pulse, half frequency signal output $f_{out}$ from the divide by two counter, while robust and more reliably distributed to additional circuitry, may not be in a format appropriate for pre-existing circuitry. For example, known phase detectors exist which require a signal in the narrow-pulse format, provided by previously-known programmable prescalers. In this case, an edge-recovery circuit may be employed.

Figure 5:
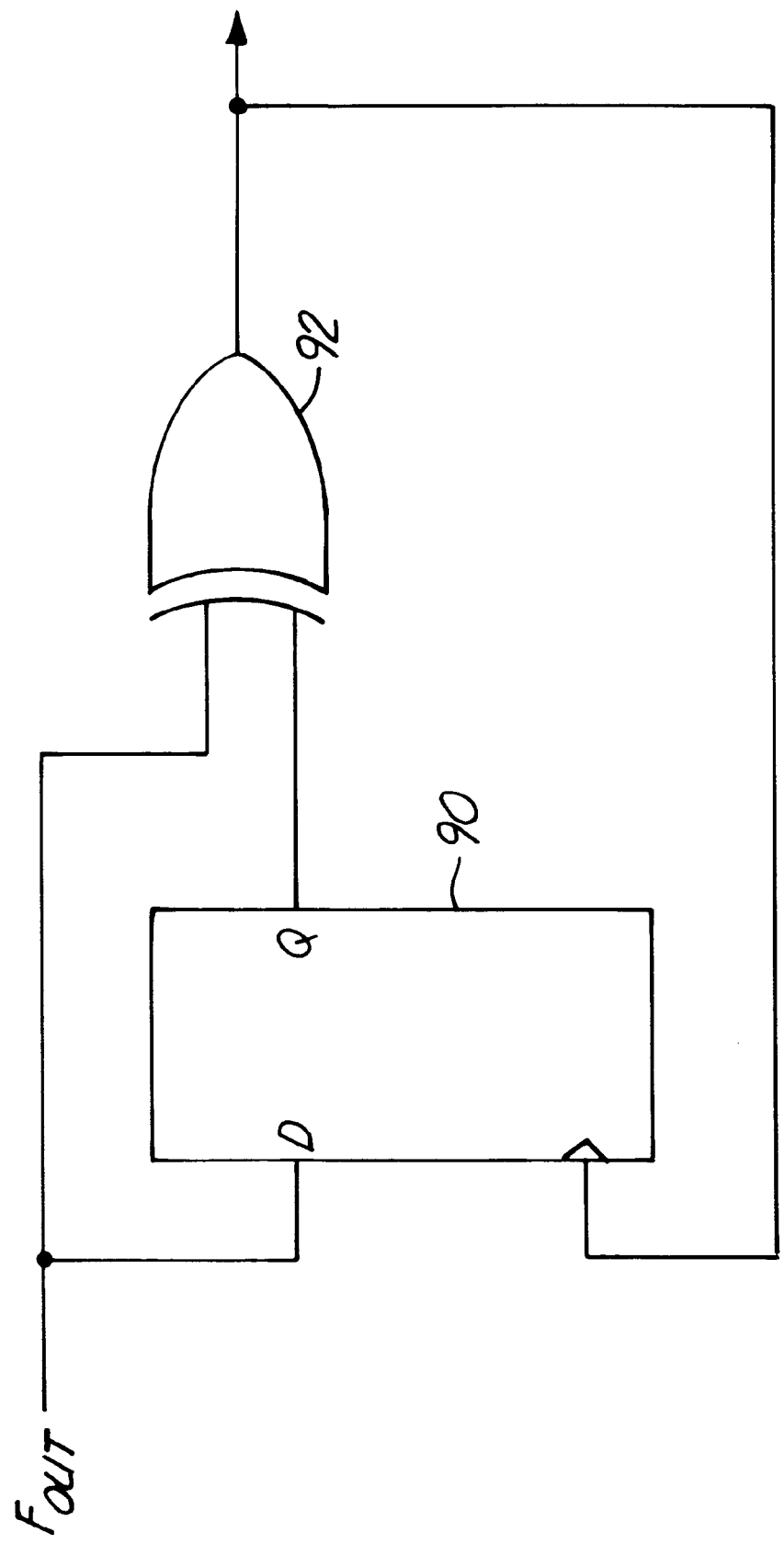
FIG. 5 is a schematic illustration of one example of an edge recovery circuit of the present invention.

One example of an edge-recovery circuit is shown in FIG. 5. In this example, the wide-pulse output $f_{out}$ of the programmable prescaler is applied to the data input of a D-type flip flop 90 and to an input of an XOR gate 92 as shown. The output of the D-type flip flop 90 is connected to the other input of the XOR gate 92. The output of the XOR gate 92 is connected to the clock input of the D-type flip flop 90. When the output of the programmable prescaler transitions logic states, the output of the D-type flip flop 90 does not change, and the XOR gate 92 output goes to a logic high. When the XOR gate 92 goes high, it clocks the newly transmitted state into the D-type flip flop 90. The delay from the time the XOR gate 92 goes high to when the D-type flip flop 90 transitions its output, plus the delay from when the D-type flip-flop 90 transitions to when the XOR gate 92 goes low again, comprises the width of the pulse recovered from each transition ("edge") of the output of the programmable prescaler.

Specific embodiments of novel high speed prescalers and prescaling methods have been described herein for purposes of illustrating the manner in which the invention may be made and used. It should be understood that implementation of other variations and modifications of the invention in its various aspects will be apparent to those skilled in the art, and that the invention is not limited thereto by the specific embodiments described. It is therefore contemplated to cover by the present invention any and all modifications, variations or equivalence that fall within the true spirit and scope of the basic underlying principles disclosed and claimed herein.

I claim:

1. A programmable prescaler, for scaling an input frequency signal into a scaled frequency signal, comprising:

an input divider having an input connected to the input frequency signal and a divided output;

a first counter, having an input connected to the divided output of the input divider and having a terminal count output; and a second counter having an input coupled to the terminal count output of the first counter and having a scaled output providing the scaled frequency signal.

2. The programmable prescaler of claim 1, wherein the second counter is a divide by two counter.

3. The programmable prescaler of claim 1, wherein the second counter is coupled to the terminal count output of the first counter via the input divider.

4. The programmable prescaler of claim 1, wherein the input divider further comprises a plurality of divider stages, the input frequency signal and the terminal count output being cascaded through the plurality of divider stages, and wherein the second counter is coupled to the terminal count output of the first counter via the plurality of divider stages of the input divider.

5. The programmable prescaler of claim 4, wherein the terminal count output of the first counter is coupled to a first divider stage of the plurality of divider stages, and an output of the first divider stage of the plurality of divider stages is connected to a clock input of the second counter.

6. The programmable prescaler of claim 4, wherein each divider stage of the plurality of divider stages is a 2/3 divider, having a frequency input, a first data input, a second data input, and a frequency output, wherein each 2/3 divider is a divide by two circuit when either the first data input or second data input is inactive, and wherein the 2/3 divider is a divide by three circuit when both the first data input and the second data input are active.

7. The programmable prescaler of claim 6, wherein the input frequency signal is connected to a first 2/3 divider stage and an output of the first 2/3 divider stage is connected to a clock input of the second counter.

8. The programmable prescaler of claim 6, wherein the first data input comprises a predetermined number of input frequency signal clock cycles to be absorbed by the input divider, and wherein the second data input is coupled to the terminal count output of the first counter.

9. The programmable prescaler of claim 1, wherein the first counter is a programmable binary counter.

10. The programmable prescaler of claim 1, wherein the scaled frequency signal has a duty cycle of approximately 50% and a frequency of one-half of a desired output frequency.

11. The programmable prescaler of claim 10, further comprising an edge detector coupled to the scaled output of the second counter.

12. A programmable prescaler, for scaling an input signal into a scaled output signal comprising:

means for dividing the input signal into a divided output signal;

first means for counting logic transitions of the divided output signal and for outputting a terminal count signal; and second means for counting coupled to the terminal count signal and for outputting a scaled output signal.

13. The programmable prescaler of claim 12, wherein the second means for counting is coupled to the terminal count signal via the means for dividing.

14. The programmable prescaler of claim 12, wherein the means for dividing further comprises a plurality of divider stages, the input signal and the terminal count signal being cascaded through the plurality of divider stages, and wherein the second means for counting is coupled to the terminal count signal via the plurality of divider stages of the means for dividing.

15. The programmable prescaler of claim 14, wherein the terminal count signal of the first means for counting is coupled to a first divider stage of the plurality of divider stages, and an output of the first divider stage of the plurality of divider stages is connected to the second means for counting.

16. The programmable prescaler of claim 14, wherein each divider stage of the plurality of divider stages is a 2/3 divider, having a frequency input, a first data input, a second data input, and a frequency output, wherein the 2/3 divider is a divide by two circuit when either the first data input or second data input is inactive, and wherein the 2/3 divider is a divide by three circuit when both the first data input and the second data input are active.

17. The programmable prescaler of claim 16, wherein an output of the first 2/3 divide stage is connected to the second means for counting.

18. The programmable prescaler of claim 16, wherein the first data input comprises a predetermined number of input frequency clock cycles to be added to the input divider, and wherein the second data input is coupled to the terminal count signal.

19. The programmable prescaler of claim 12, further comprising means for detecting edge transactions of the scaled output signal of the second means for counting.

20. A method for prescaling on input signal having a first frequency into an output signal having a second frequency comprising the steps of:

dividing the input signal into a divided output signal;

counting logic transitions of the divided output signal and outputting a terminal count signal; and counting logic transitions of the terminal count signal and generating the output signal having the second frequency of the one-half of the terminal count signal.

21. The method of claim 20, further comprising the step of:

detecting the edge transactions of the output signal.

22. The method of claim 20, wherein the step of counting logic transitions of the terminal count signal and generating the output signal further comprises the steps of:

retiming the terminal count signal in at least one stage of an input divider; and dividing the retimed terminal count signal by two.

* * * * *